United States Patent
Lee et al.

(10) Patent No.: US 10,283,347 B2
(45) Date of Patent: May 7, 2019

(54) TOUCH SENSING UNIT AND DISPLAY DEVICE

(71) Applicant: Samsung Display Co., Ltd., Yongin-si (KR)

(72) Inventors: Choon-Hyop Lee, Suwon-si (KR); Hee-Woong Park, Hwaseong-si (KR); Kang-Won Lee, Seoul (KR); Jeong-Heon Lee, Seongnam-si (KR); Won-Gu Cho, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/668,419

(22) Filed: Aug. 3, 2017

(65) Prior Publication Data
US 2018/0061634 A1 Mar. 1, 2018

(30) Foreign Application Priority Data
Aug. 26, 2016 (KR) .................. 10-2016-0109348

(51) Int. Cl.
| | |
|---|---|
| *H05K 1/02* | (2006.01) |
| *H05K 1/03* | (2006.01) |
| *H05K 3/28* | (2006.01) |
| *H05K 3/36* | (2006.01) |
| *G06F 3/041* | (2006.01) |
| *H01L 21/02* | (2006.01) |
| *H01L 21/768* | (2006.01) |

(52) U.S. Cl.
CPC ........ *H01L 21/02104* (2013.01); *G06F 3/041* (2013.01); *H01L 21/76868* (2013.01); *H05K 1/028* (2013.01); *H05K 1/0393* (2013.01); *H05K 3/361* (2013.01); *H05K 3/281* (2013.01); *H05K 2201/09909* (2013.01); *H05K 2201/10128* (2013.01); *H05K 2203/1178* (2013.01)

(58) Field of Classification Search
CPC ...... H05K 1/028; H05K 1/0393; H05K 3/361; H05K 3/281; H05K 2201/10128; H05K 2201/09909; G06F 3/041; H01L 21/02104; H01L 21/76868
USPC .................................................. 345/173, 175
See application file for complete search history.

(56) References Cited

U.S. PATENT DOCUMENTS

| | | | | |
|---|---|---|---|---|
| 2014/0168529 A1* | 6/2014 | Lin | ..................... | G02F 1/13452 349/12 |
| 2015/0092122 A1 | 4/2015 | Youn | | |
| 2015/0301662 A1* | 10/2015 | Kuwajima | .......... | G02F 1/13338 345/173 |
| 2017/0123557 A1* | 5/2017 | Na | ........................ | G06F 3/0412 |

FOREIGN PATENT DOCUMENTS

| | | |
|---|---|---|
| KR | 10-1999-0002250 | 1/1999 |
| KR | 10-2015-0035241 | 4/2015 |

* cited by examiner

*Primary Examiner* — Jasmine J Clark
(74) *Attorney, Agent, or Firm* — H.C. Park & Associates, PLC

(57) ABSTRACT

A display device including a first film, a flexible printed circuit, and a second film. The first film includes a substrate and a non-adhesive pattern, where the substrate includes a first area and a second area adjacent to the first area, and the non-adhesive pattern is formed on at least a portion of the second area. The flexible printed circuit is disposed on the first area of the first film. The second film is disposed on the flexible printed circuit and the first film.

20 Claims, 9 Drawing Sheets

TOUCH SENSING UNIT AND DISPLAY DEVICE

CROSS-REFERENCE TO RELATED APPLICATION

This application claims priority from and the benefit of Korean Patent Application No. 10-2016-0109348, filed on Aug. 26, 2016, which is hereby incorporated by reference for all purposes as if fully set forth herein.

BACKGROUND

Field

Exemplary embodiments of the inventive concept relate to a display device. More particularly, exemplary embodiments of the inventive concept relate to a touch sensing unit and a display device.

Discussion of the Background

A display device includes a display panel displaying an image based on input data, a touch sensing unit (or a touch sensing panel, a touch panel) receiving a touch input, and a polarizing film. The touch sensing unit includes a sensor (or a sensing panel) and a flexible printed circuit located or deposited on a portion of the sensor (e.g., on a dead space). The polarizing film is located or deposited on the touch sensing unit (and on the flexible printed circuit). During a process for depositing the polarizing film on the touch sensing unit, air bubbles occur (and remain) due to a gap between the touch sensing unit and the polarizing film (e.g., a gap caused by the flexible printed circuit).

When the air bubbles are not discharged to an outside, the air bubbles go to the inside of the display panel (or grow into an area corresponding to a displaying area of the display panel), thereby rendering the display panel defective.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a touch sensing unit capable of removing or expiring air bubbles which occur between films during a manufacturing process of a display device.

Exemplary embodiments also provide a display device capable of removing or expiring air bubbles which occur between films during a manufacturing process of a display device.

Additional aspects will be set forth in the detailed description which follows, and, in part, will be apparent from the disclosure, or may be learned by practice of the inventive concept.

An exemplary embodiment discloses a display device including a first film including a substrate including a first area and a second area adjacent to the first area and a non-adhesive pattern formed on at least a portion of the second area; a flexible printed circuit disposed on the first area of the first film; and a second film disposed on the flexible printed circuit and the first film.

The non-adhesive pattern may include fluorine or silicon.

The non-adhesive pattern may have an adhesive strength less than an adhesive strength of the substrate.

A first air path may be formed between the non-adhesive pattern and the second film, and air bubbles generated between the first film and the second film may be discharged to the outside through the first air path.

The non-adhesive pattern may be formed on a third portion of the second area adjacent to a corner of the first area.

The non-adhesive pattern may be formed on a first portion of the second area adjacent to the first area in a first direction.

The non-adhesive pattern may be formed on a first portion of the second area adjacent to the first area in a second direction perpendicular to the first direction.

The non-adhesive pattern may have a thickness less than a thickness of the flexible printed circuit.

A width of the non-adhesive pattern may be inversely proportional to a thickness of the flexible printed circuit.

The width of the non-adhesive pattern may be greater than or equal to 20 μm.

The non-adhesive pattern may be spaced apart from the first area by a first distance.

The first distance may be proportional to a thickness of the flexible printed circuit.

The non-adhesive pattern may partially overlap the flexible printed circuit.

The flexible printed circuit may include a flexible substrate, and a second non-adhesive pattern formed on at least a portion of the flexible substrate corresponding to the first area, the second non-adhesive pattern extending in a first direction.

A second air path may be formed between the second non-adhesive pattern and the second film.

A touch sensing unit may include a first film including a substrate including a first area and a second area adjacent to the first area and a non-adhesive pattern formed on at least a portion of the second area; a flexible printed circuit disposed on the first area of the first film; and a second film disposed on the flexible printed circuit and the first film.

The non-adhesive pattern may include fluorine or silicon.

The non-adhesive pattern may have an adhesive strength less than an adhesive strength of the substrate.

The non-adhesive pattern may be formed on a third portion of the second area adjacent to a corner of the first area.

The non-adhesive pattern may be formed on a first portion of the second area adjacent to the first area in a first direction.

Therefore, a touch sensing unit according to exemplary embodiments may include a non-adhesive pattern on a second area of a first film (e.g., an area surrounding a first area where a flexible printed circuit is located) and may form an air path between a first film and a second film (or between a first substrate and the flexible printed circuit) using the non-adhesive pattern. Therefore, air bubbles generated between the films may be discharged to the outside through the air path, thereby reducing the number of defects of the touch sensing unit due to the air bubbles.

In addition, a display device according to exemplary embodiments may discharge air bubbles to the outside and may reduce the number of defects due to the air bubbles by including the touch sensing unit.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
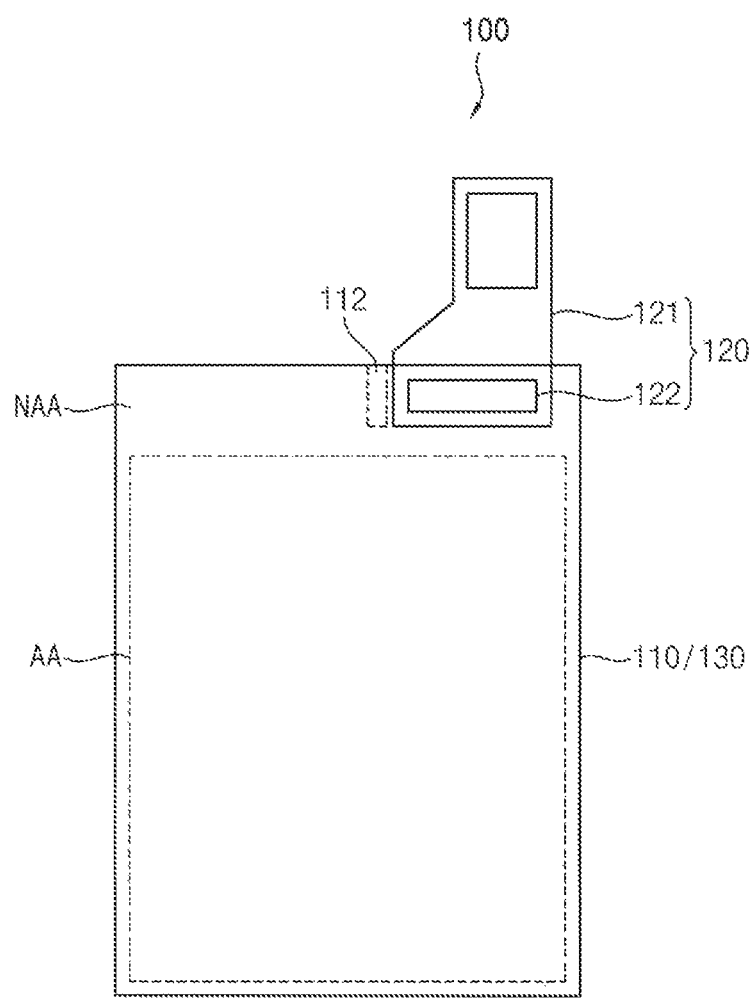
FIG. 1 is a diagram illustrating a touch sensing unit according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
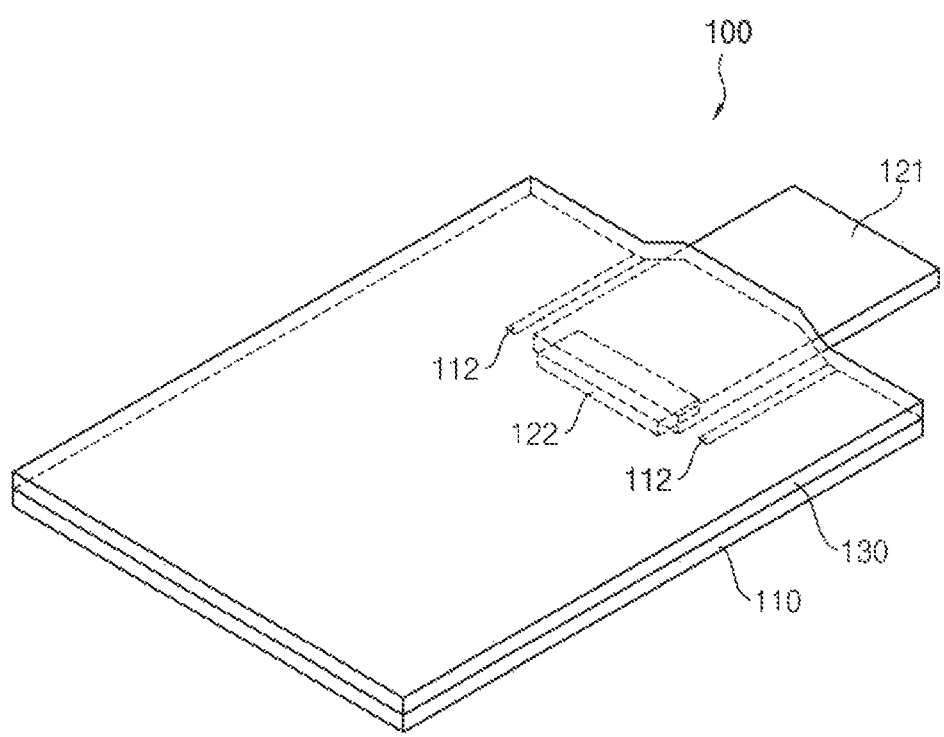
FIG. 2 is a diagram illustrating an example of the touch sensing unit of FIG. 1.

FIG. 1 is a diagram illustrating a touch sensing unit according to Exemplary embodiments. FIG. 2 is a diagram illustrating an example of the touch sensing unit of FIG. 1.

Referring to FIGS. 1 and 2, the touch sensing unit 100 may include first and second films 110 and 130 (or sheets, panels) and a flexible printed circuit 120. The touch sensing unit 100 may be included in a display device. The touch sensing unit 100 may be located or deposited on a front surface (or a rear surface) of the display device.

The second film 130 may have a shape (or size, area) which is the same as a shape (or size, area) of the first film 110. For example, the first film 110 may be a sensing panel to sense a touch input, and the second film 130 may be a polarizing film.

The first film 110 may include an active area AA and a non-active area NAA, the active area AA includes a sensor (or electrode) to sense the touch input of a user, and the non-active area NAA may be a remaining area of the first film 110 excluding the active area AA (e.g., an edge or a dead space of the first film 110). For example, the active area AA may correspond to a displaying area of a display panel (e.g., an area including pixels and exposed to an outside of the display panel), and the non-active area NAA may correspond to a non-displaying area of the display panel (e.g., a dead space).

In an exemplary embodiment, the first film 110 may include a substrate and a non-adhesive pattern 112 (or a non-adhesion pattern). The substrate may include a first area (e.g., an adhesive area) and a second area (e.g., a non-adhesive area). The first area may be a portion of the non-active area NAA, and may include lines (or pads, bumps) electrically connected to the flexible printed circuit 120. The second area may be a portion of the non-active area NAA and may be adjacent to the first area. For example, the second area may surround the first area.

The non-adhesive pattern 112 may be deposited on at least a portion of the second area. The non-adhesive pattern 112 may include fluorine or silicon. For example, the non-adhesive pattern 112 may be formed through a hydrophobic surface treatment of the substrate.

The non-adhesive pattern 112 may have a surface energy lower than a surface energy of the substrate, or may have an adhesive strength (or adhesion) less than an adhesive strength of the substrate. When the first film 110 is deposited on the second film 130, the non-adhesive pattern 112 may prevent a specific portion (e.g., the second area) of the first film 110 from adhering to the second film 130.

An air path may be formed between the non-adhesive pattern and the second film 130, and air bubbles between the first and second films 110 and 130 may be discharged to the outside through the air path.

As illustrated in FIG. 2, a first distance between the first film 110 and the second film 130 at the non-active area NAA (e.g., 0 μm) may be different from a second distance between the first film 110 and the second film 130 at the first area (e.g., tens or hundreds μm). That is, a gap (or a difference between the first distance and the second distance) may occur as a result of the flexible printed circuit 120. During a process of depositing the second film 130 on the first film 110 and on the flexible printed circuit 120, the air bubbles may occur between the first film 110 and the second film 130 (e.g., around the flexible printed circuit 120). If the air bubbles were not discharged (or not expired, not exhausted, not output) to the outside, the air bubbles may go (or grow) inside of the touch sensing unit 110 (or in a direction from an edge to a center of the first film 110), thereby rendering the touch sensing unit 100 defective.

Therefore, the touch sensing unit 100 according to exemplary embodiments may prevent defects of the touch sensing unit 100 by forming the air path using the non-adhesive pattern 112 and by discharging the air bubbles between the first and second films 110 and 130 to the outside.

In an exemplary embodiment, the non-adhesive pattern 112 may be formed before or after the flexible printed circuit 120 is deposited (or attached) on the first film 110. A time point at which the non-adhesive pattern 112 will be described with reference to FIGS. 7A and 7B.

The flexible printed circuit 120 may be located on the first area of the first film 110. Here, the first area may be a portion of the non-active area NAA.

The flexible printed circuit 120 may include a substrate 121, a pad unit 122, and a controller. The substrate 121 may be a flexible substrate. The pad unit 122 may include pads (or bumps) electrically connecting the first film 110 and the flexible printed circuit 120. The pads may be electrically connected to lines (or pads, bumps) arranged on the first film 110.

The controller may supply a power to the first film 110 through the pad unit 122, may receive a sensing signal (e.g., a signal corresponding to a change of conductance due to the touch input) through the pad unit 122, and may calculate a location of the touch input based on the sensing signal. For example, the controller may be implemented as an integrated circuit (referred as to "IC").

As described above, the touch sensing unit 100 may include the non-adhesive pattern 112 on the second area of the first film 110 (e.g., an area surrounding the first area on which the flexible printed circuit 120 is located) and may form the air path between the first film 110 and the second film 130 (or between the first film 110 and the flexible printed circuit 120) using the non-adhesive pattern 112. Therefore, the touch sensing unit 100 may discharge the air bubbles, which occur between the first film 110 and the second film 130, to the outside through the air path, and may prevent defects resulting from the air bubbles.

Figure 3A:
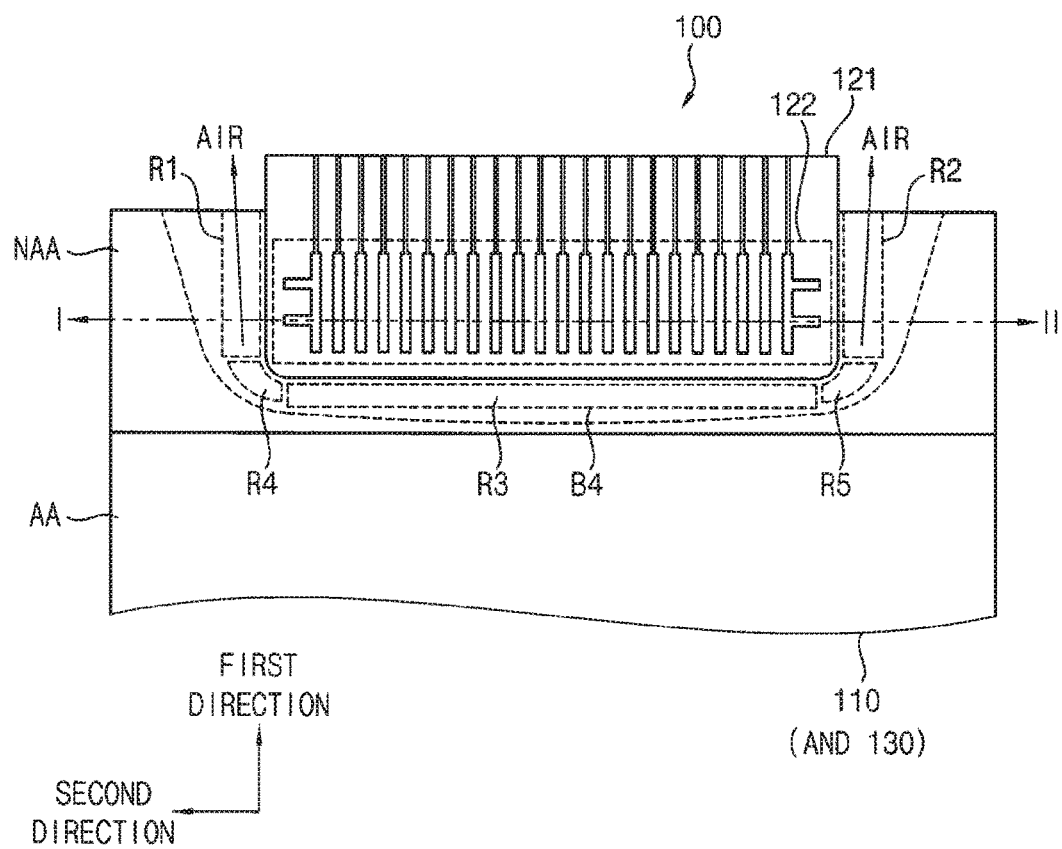
FIG. 3A is a diagram illustrating an example of the touch sensing unit of FIG. 1.
Figure 3B:
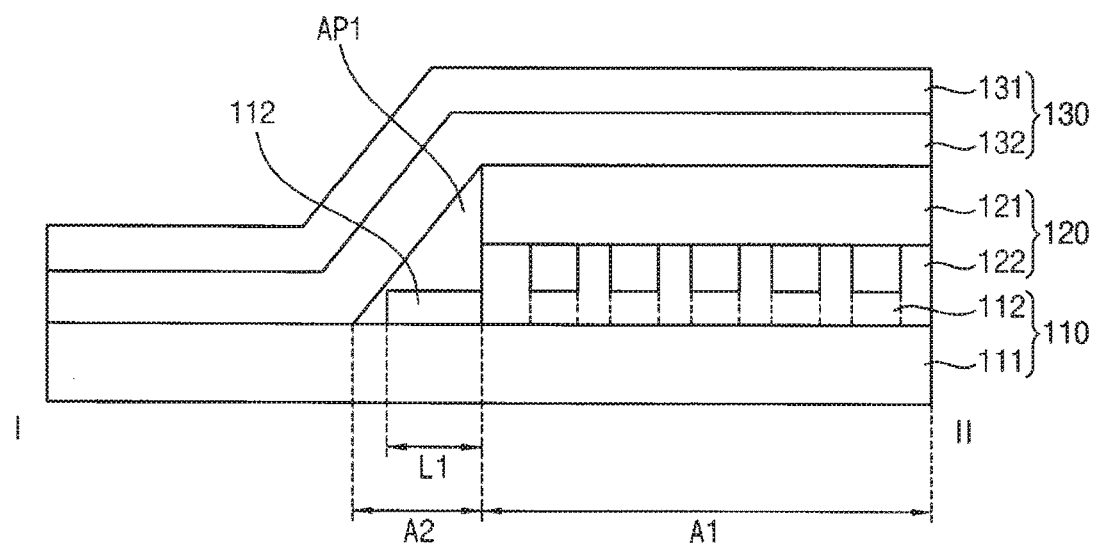
FIG. 3B, FIG. 3C, and FIG. 3D are diagrams illustrating an example of a cross-section of the touch sensing unit of FIG. 3A.
Figure 3C:
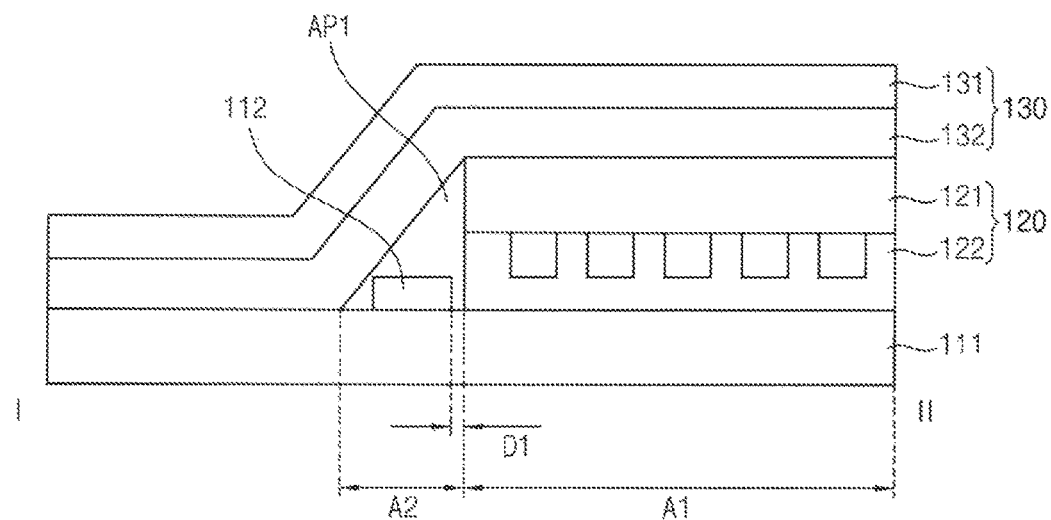
Figure 3D:
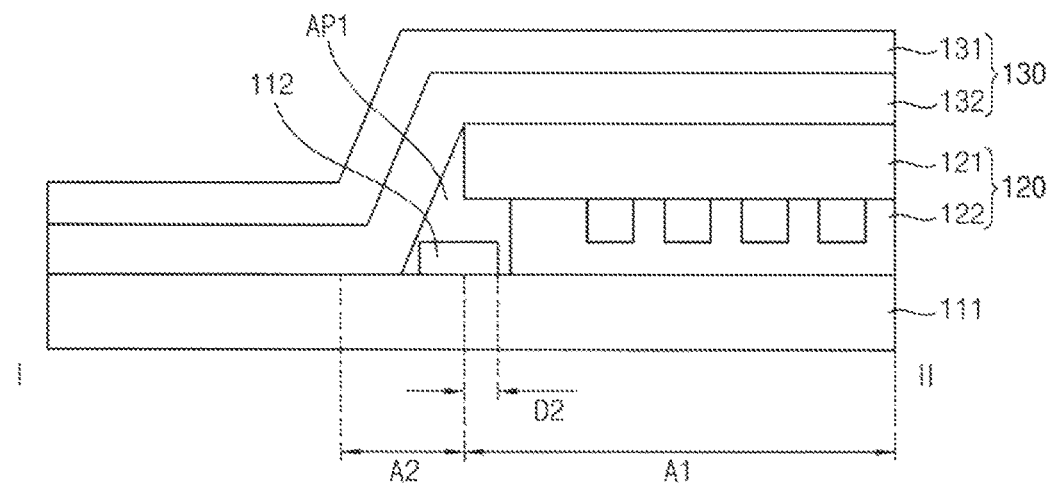

FIG. 3A is a diagram illustrating an example of the touch sensing unit of FIG. 1. FIGS. 3B through 3D are diagrams illustrating an example of a cross-section of the touch sensing unit of FIG. 3A.

Referring to FIGS. 3A and 3B, the touch sensing unit 100 may include the first film 110, the flexible printed circuit 120, and the second film 130. The first film 110 may include the non-adhesive pattern 112 formed on at least a portion of the first area A1 of the substrate 111. The first film 110, the flexible printed circuit 120, and the second film 130 may be the same as the first film 110, the flexible printed circuit 120, and the second film 130 described with reference to FIGS. 1 and 2. Therefore, duplicate descriptions thereof will not be repeated.

The first film 110 may include a substrate 111 and the non-adhesive pattern 112 located on the second area A2. As illustrated in FIG. 3B, the non-adhesive pattern 112 may reduce a contact angle between the first film 110 and the second film 130 at an edge (or a boundary) of the second area A2 and may prevent attachment of the first film 110 to the second film 130 in the second area A2.

The flexible printed circuit 120 may include the flexible substrate 121 and the pad unit 122. The pad unit 122 may include pads. The pads may extend in a first direction on the flexible substrate 121, and may be arranged along a second direction perpendicular to the first direction. The pad unit 122 may further include a first adhesive layer (or a first adhesion layer). The first adhesive layer may be formed under the flexible substrate 121 and the pad unit 122 (or between the flexible substrate 121 and the first film 110). For example, the first adhesive layer may be anisotropic conductive film such as an epoxy resin film, may cover the first area A1 of the first film 110 (or may overlap with the first area A1 of the first film 110), and may bond the flexible printed circuit 120 to the first film 110.

The second film 130 may include a polarizing layer 131 and a second adhesive layer 132. The second adhesive layer 132 may be formed under the polarizing layer 131 (or between the polarizing layer 131 and the first film 110). For example, the second adhesive layer 132 may be a pressure sensitive adhesive and may bond the first film 110 and the flexible printed circuit 120.

Figure 4:
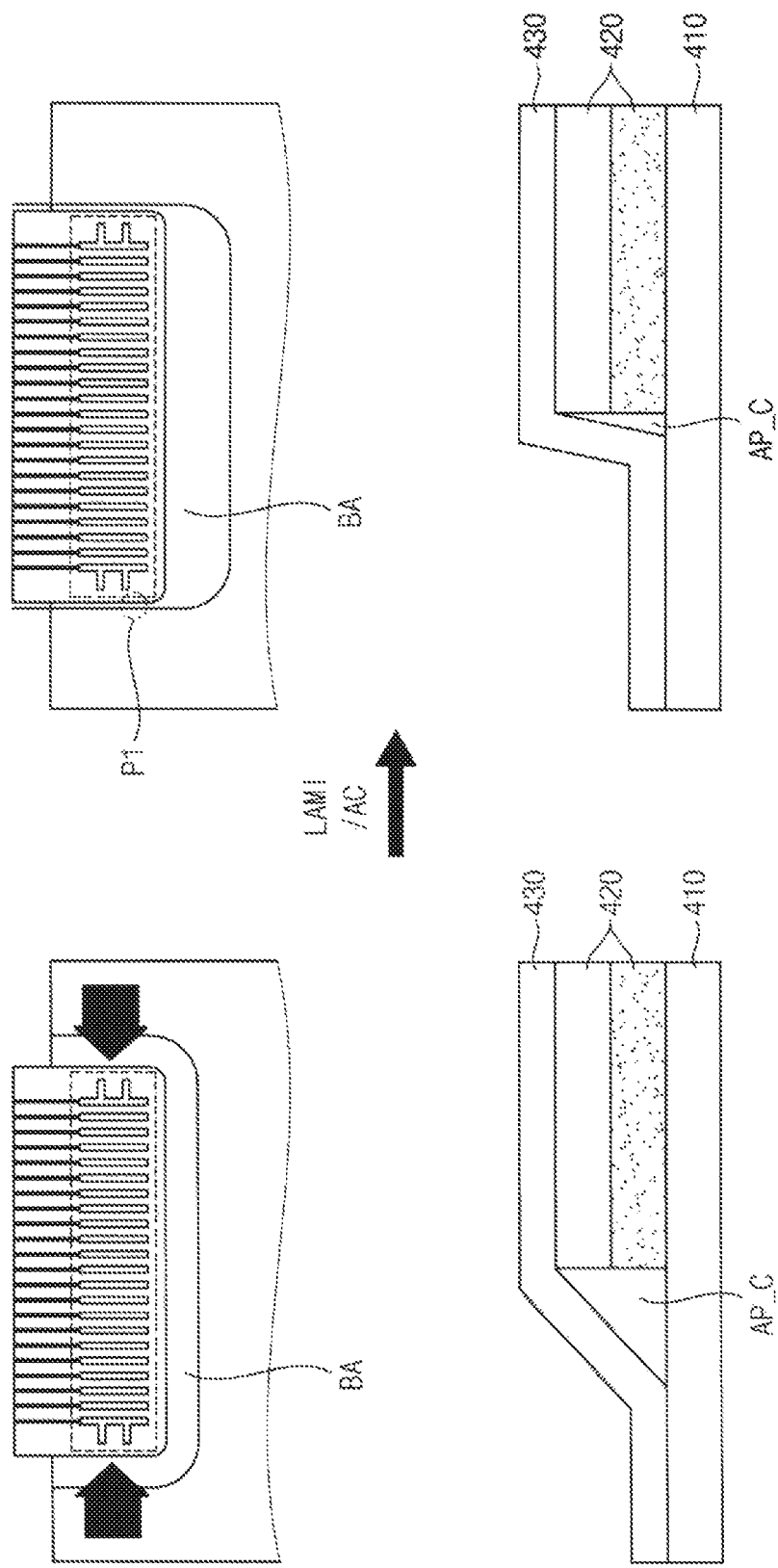
FIG. 4 is a diagram illustrating a comparative example of the touch sensing unit of FIG. 1.

When the second film 130 is located on the first film 110 and on a portion of the flexible printed circuit 120, an air bubble area BA including air bubbles may occur around the flexible printed circuit 120, as shown in FIG. 4. The air bubbles may occur through a module process of the display device 100 (e.g., a lamination process and an autoclave process) but may be discharged through various air paths.

As illustrated in FIG. 3B, a first air path AP1 may be formed between the adhesive pattern 112 and the pad unit 122 (or between the adhesive pattern 112 and the flexible printed circuit 120). That is, the first air path AP1 may be formed along a boundary of the flexible printed circuit 120

(or along a boundary of the first area A1, along a boundary of the second area A2). The air bubbles may be discharged to the outside through the first air path AP1.

In an exemplary embodiment, the non-adhesive pattern 112 may be formed on at least one of first through fifth partial regions R1 through R5. Here, the first through fifth partial regions R1 through R5 may be included in the second area A2.

The first partial region R1 may be located adjacent to the first area A1 in a second direction with respect to the first area A1. The second partial region R2 may be adjacent to the first area A1 in a direction opposite to the second direction with respect to the first area A1. The third partial region R3 may be adjacent to the first area A1 in a direction opposite to the first direction with respect to the first area A1. The fourth and fifth partial regions R4 and R5 may be adjacent to corners of the first area A1 (e.g., to a part with the smallest curvature of the first area A1). For example, when the first area A1 has a shape of a rectangle, the fourth and fifth partial regions R4 and R5 may correspond to corners of the rectangle.

When the non-adhesive pattern 112 is formed on the first partial region R1 and the second partial region R2, the first air path AP1 may be formed corresponding to the first and second partial regions R1 and R2. Here, the first air path AP1 may connect the inside and the outside of the touch sensing unit 100 such that the air bubbles may be discharged more easily along the first and second partial regions R1 and R2.

When the non-adhesive pattern 112 is formed on the third partial region R3, the first air path AP1 may be formed corresponding to the third partial region R3. Here, the first air path AP1 may prevent the air bubbles from being concentrated at some points (e.g., points at which adhesion between the first film 110 and the second film 130 is relatively weak, or a center point of the third partial region R3), may distribute the air bubbles around the third partial region R3, and may guide the air bubbles to move to the first and second partial regions R1 and R2 (or to the fourth and fifth partial regions R4 and R5).

When the non-adhesive pattern 112 is formed on the fourth partial region R4 and the fifth partial region R5, the first air path AP1 may be formed corresponding to the fourth and fifth partial regions R4 and R5. For example, when the flexible printed circuit 120 (or the first area A1) has a shape of a rectangle, a distance between the first film 110 and the second film 130 (or the first air path AP1) at the fourth and fifth regions R4 and R5 may be relatively narrow such that the air bubbles in the third partial region R3 may not be moved to the first and second partial regions R1 and R2. Therefore, when the non-adhesive pattern 112 may be formed on the fourth and fifth partial regions R4 and R5, the air bubbles in the third partial region R3 may be discharged through the first and second partial regions R1 and R2.

In an exemplary embodiment, the non-adhesive pattern 112 may have a thickness less than a thickness of the flexible printed circuit 120. For example, the thickness of the non-adhesive pattern 112 may be half the thickness of the flexible printed circuit 120. Because a cross-sectional area of the first air path AP1 may be reduced as the thickness of the non-adhesive pattern 112 increases even though the first film 110 is not attached to the second film 130 in the second area A2 by the non-adhesive pattern 112.

In an exemplary embodiment, a width L1 of the non-adhesive pattern 112 may be determined based on the thickness of the flexible printed circuit 120. For example, the cross-sectional area of the first air path AP1 may be determined considering of a flowing efficiency of the air bubbles, and the cross-sectional area of the first air path AP1 may be proportional to a multiplication of the width L1 of the non-adhesive pattern 112 and the thickness of the flexible printed circuit 120. Here, the width L1 of the non-adhesive pattern 112 may be inversely proportional to the thickness of the flexible printed circuit 120.

In an exemplary embodiment, the width L1 of the non-adhesive pattern 112 may be greater than or equal to 20 μm. For example, the first film 110 may be manufactured independently of the flexible printed circuit 120, and may be applied to the flexible printed circuit 120 having various thickness. Therefore, the width L1 of the non-adhesive pattern 112 may be greater than or equal to 20 μm considering a minimum cross-sectional area of the non-adhesive pattern 112.

Referring to FIG. 3C, the non-adhesive pattern 112 may be spaced apart from the first area A1 by a first distance D1. For example, the second film 130 may be spaced apart from a side of the flexible printed circuit 120 by a certified distance according to a bending characteristic of the second film 130 and the thickness of the flexible printed circuit 120 even through the non-adhesive pattern 112 is not disposed on the first film 110. Similarly, the second film 130 may not be attached to the first film 110 by a certified gap with respect to a boundary of the non-adhesive pattern 112 according to the bending characteristic of the second film 130 and the thickness of the non-adhesive pattern 112. Therefore, even though the non-adhesive pattern 112 is space apart from the first area A1 by the first distance D1 (e.g., a sum of the certified distance and the certified gap), the second film 130 may not be attached to the first film 110 in the second area A2 such that the first air path AP1 may be maintained. In addition, even though a size of the flexible printed circuit 120 and an arrangement location of the flexible printed circuit have an error (or a part of the flexible printed circuit 120 deviates from the first area A1), the flexible printed circuit 120 may be located (or attached) on the first film 110.

Referring to FIG. 3D, the non-adhesive pattern 112 may partially overlap with the flexible printed circuit 120 by a second distance D2 with respect to the first area A1. For example, the first adhesive layer (or the pad unit 122) of the flexible printed circuit 120 may have a width less than a width of the flexible substrate 121. Here, the non-adhesive pattern 112 may be formed on the first film 110.

As described with references to FIGS. 3A through 3D, the touch sensing unit 100 according to an exemplary embodiment may include the non-adhesive pattern 112 formed on at least a portion of the substrate 111 (or the first film 110) and may guide the air bubble in the touch sensing unit 100 to the outside along the boundary of the flexible printed circuit 120 (or along the second area A2).

FIG. 4 is a diagram illustrating a comparative example of the touch sensing unit of FIG. 1.

Referring to FIGS. 3A, 3B, and 4, a comparative touch sensing unit may not include non-adhesive pattern 112 compared with the touch sensing unit 100 according to exemplary embodiments.

The first comparative film 410 may be located on the comparative flexible printed circuit 420. The second comparative film 430 may be located on the first comparative film 410 and the comparative flexible printed circuit 420. When the comparative film 430 is deposited on the first comparative film 410 (e.g., during a lamination process), the air bubble area BA may occur.

Though a comparative air path AP_C is formed between the first comparative film 410 and the comparative film 430

(or between the first and second comparative films 410 and 430 and the comparative flexible printed circuit 420), the comparative air path AP_C may be narrowed through the lamination process and an autoclave process. The air bubbles may not be discharged smoothly or completely through the comparative air path AP_C and may instead go in the active area AA of the first comparative film 410. That is, the air bubbles may be in a displaying area displaying an image (or in the active area AA corresponding to the displaying area) and may be visible or seen by a user. Therefore, a quality of the image displayed on the displaying area may be deteriorated. Specifically, as a trend continues toward a small-size bezel for the display device, a non-displaying area of the display device (or the non-active area NAA corresponding to the non-displaying area of the display device) is narrowed. Here, defects due the air bubbles may occur more frequently.

The touch sensing unit 100 according to an exemplary embodiment may form an air path using the non-adhesive pattern 112 and may output the air bubbles through the air path. Therefore, the touch sensing unit 100 may prevent defects caused by the presence of the air bubbles.

Figure 5:
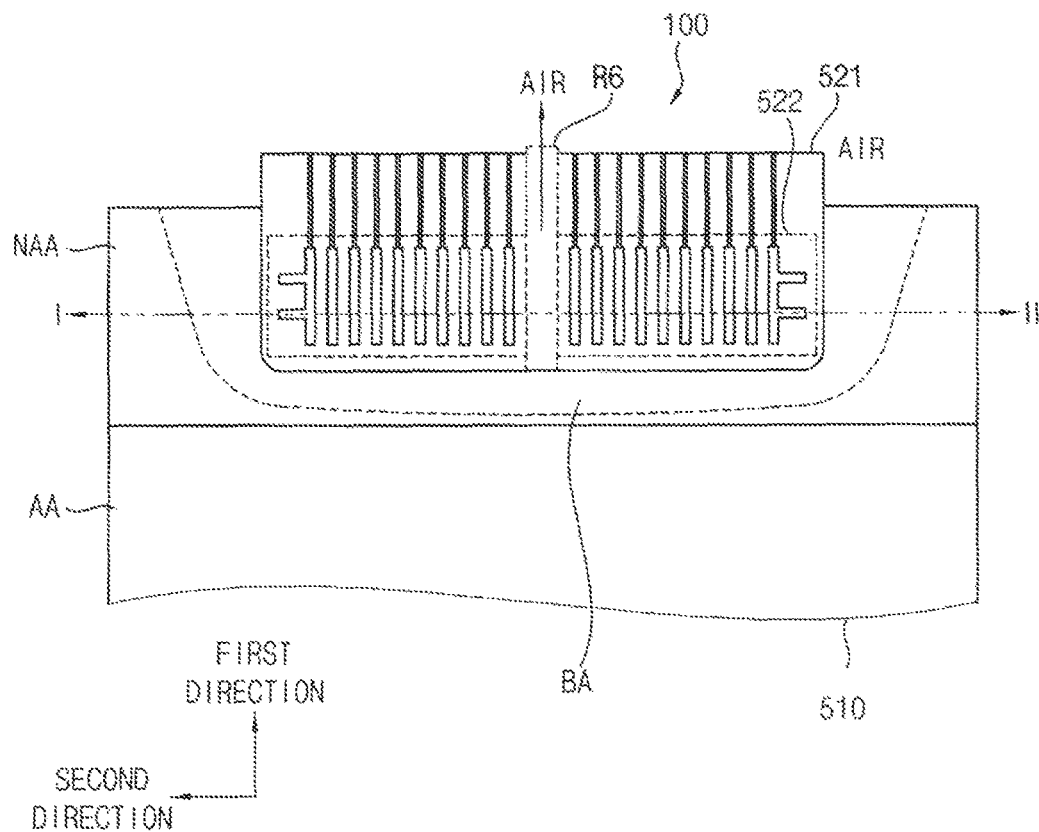
FIG. 5 is a diagram illustrating an example of the touch sensing unit of FIG. 1.
Figure 6:
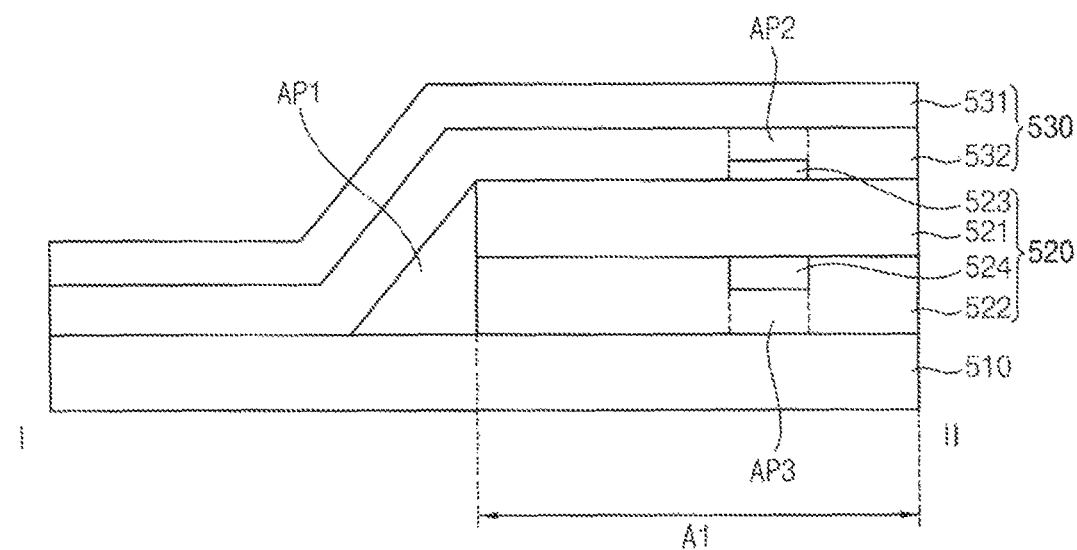
FIG. 6 is a diagram illustrating an example of a cross-section of the touch sensing unit of FIG. 5.

FIG. 5 is a diagram illustrating an example of the touch sensing unit of FIG. 1. FIG. 6 is a diagram illustrating an example of a cross-section of the touch sensing unit of FIG. 5.

Referring to FIGS. 5 and 6, the touch sensing unit 100 may include a first film 510, a flexible printed circuit 520, and a second film 530. The first film 510, the flexible printed circuit 520, and the second film 530 may be substantially the same as the first film 110, the flexible printed circuit 120, and the second film 130 described with reference to FIGS. 3A and 3B, respectively. Therefore, duplicate descriptions thereof will not be repeated.

The flexible printed circuit 520 may further include non-adhesive patterns 523 and 524 with respect to the flexible printed circuit 120 described with reference to FIGS. 3A and 3B.

The non-adhesive patterns 523 and 524 may be formed on (or under) at least a portion of a flexible substrate 521 corresponding to the first area A1 and may extend in the first direction. The non-adhesive patterns 523 and 524 may extend from an edge of the flexible substrate 521 (or from the air bubble area BA) to an edge of the first film 510 (or to an edge of the second film 530). The non-adhesive patterns 523 and 524 may include fluorine or silicon. For example, the non-adhesive patterns 523 and 524 may be formed through a hydrophobic surface treatment for the flexible substrate 521.

The non-adhesive patterns 523 and 524 may have a surface energy lower than a surface energy of the flexible substrate 521. When the flexible printed circuit 520 is attached on the first film 510 or when the second film 530 is attached on the flexible printed circuit 520, the non-adhesive patterns 523 and 524 may prevent a specific portion (e.g., a sixth partial region R6 across the first area A1) of the flexible printed circuit 520 from adhering to the second film 530. Here, second and third air paths AP2 and AP3 may be formed between the non-adhesive patterns 523 and 524 and first and second films 510 and 530, and the air bubbles between the first and second films 510 and 530 may be discharged to an outside through the second and third air paths AP2 and AP3.

The second non-adhesive pattern 523 may be formed on the flexible substrate 521 corresponding to the sixth partial region R6. Here, the second air path AP2 may be formed between the second non-adhesive pattern 523 and the second film 530 and may connect the air bubble area BA to the outside across the first area A1. Therefore, the air bubbles may be discharged form the inside of the touch sensing unit 100 to the outside through the second air path AP2.

Similarly, the third non-adhesive pattern 524 may be formed under the flexible substrate 521 corresponding to the sixth partial region R6. Here, the third air path AP3 may be formed between the third non-adhesive pattern 524 and the first film 510 and may connect the air bubble area BA to the outside across the first area A1. Therefore, the air bubbles may be discharged form the inside of the touch sensing unit 100 to the outside through the third air path AP3.

The third non-adhesive pattern 524 may not overlap the pads in the flexible printed circuit 520. The pads may be substantially the same as the pads described with reference to FIGS. 3A and 3B and may be electrically connected to lines (or pads, bumps) arranged on the first film 510. For example, the third non-adhesive pattern 524 may be spaced apart from the pads. For example, the third non-adhesive pattern 524 may be located adjacent to a boundary of the first A1 in a manner similar to the non-adhesive pattern 112 described with reference to FIG. 3D.

FIG. 6 illustrates that the touch sensing unit 100 includes only the second and third non-adhesive patterns 523 and 524. However, exemplary embodiments including the touch sensing unit 100 are not limited thereto. For example, the touch sensing unit 100 may further include the non-adhesive pattern 112 described with reference to FIGS. 3A through 3D. Here, the touch sensing unit 100 may easily output the air bubbles to the outside through the first through third air paths AP1, AP2, and AP3, respectively.

As described with reference to FIGS. 5 and 6, the touch sensing unit 100 according to Exemplary embodiments may include non-adhesive patterns 523 and 524 formed on or under the flexible substrate 521 (or the flexible printed circuit 520) and may output the air bubbles to the outside across the flexible printed circuit 520.

Figure 7A:
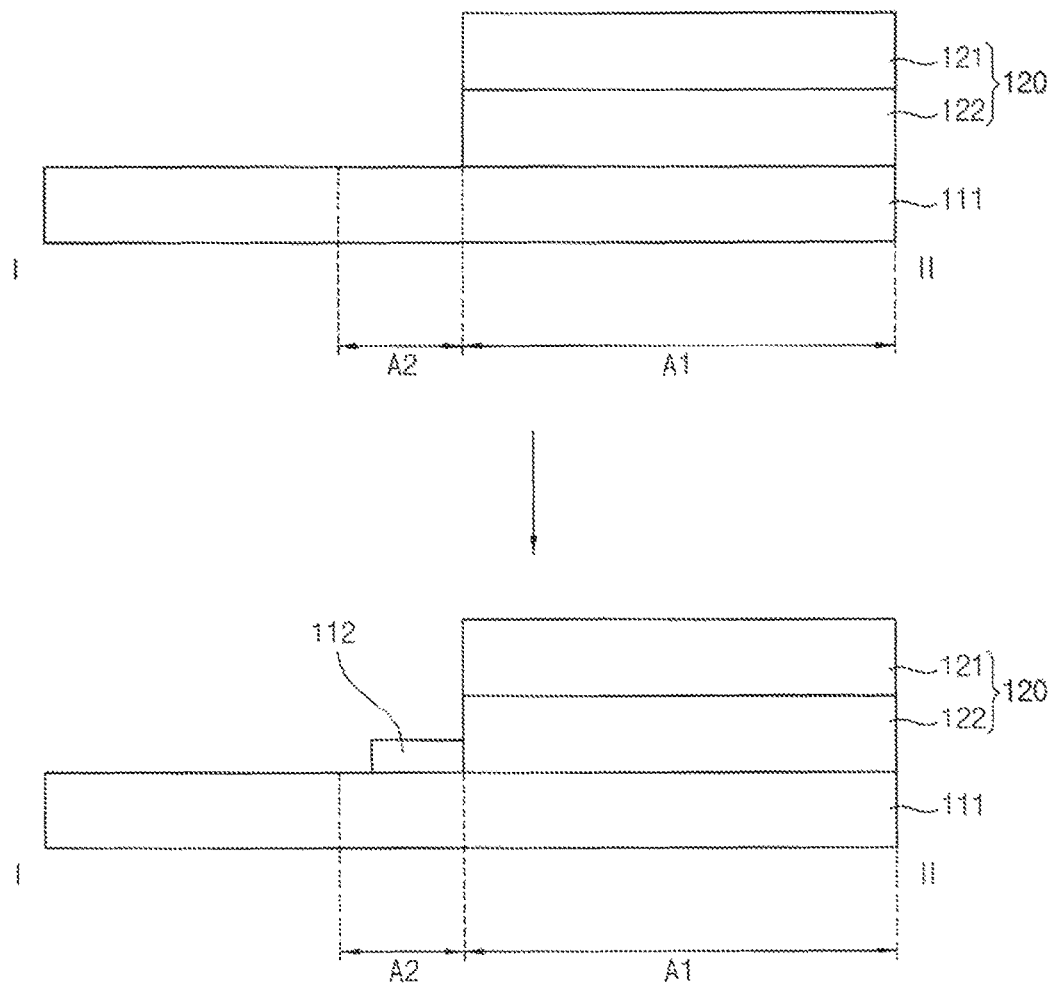
FIG. 7A and FIG. 7B are diagrams illustrating a process of manufacturing the touch sensing unit of FIG. 3A.
Figure 7B:
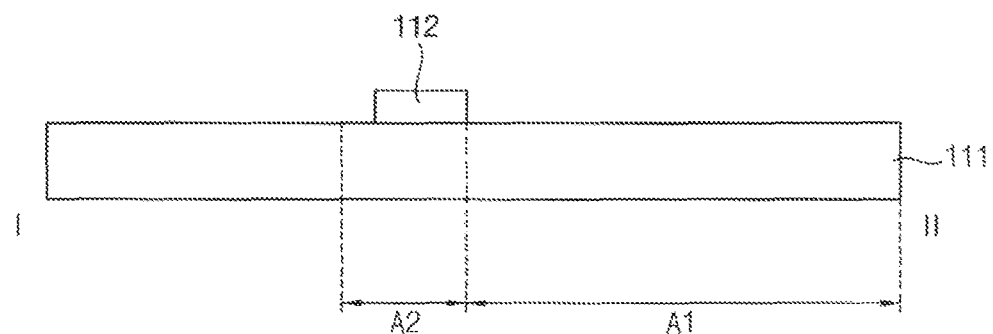
Figure 7B:
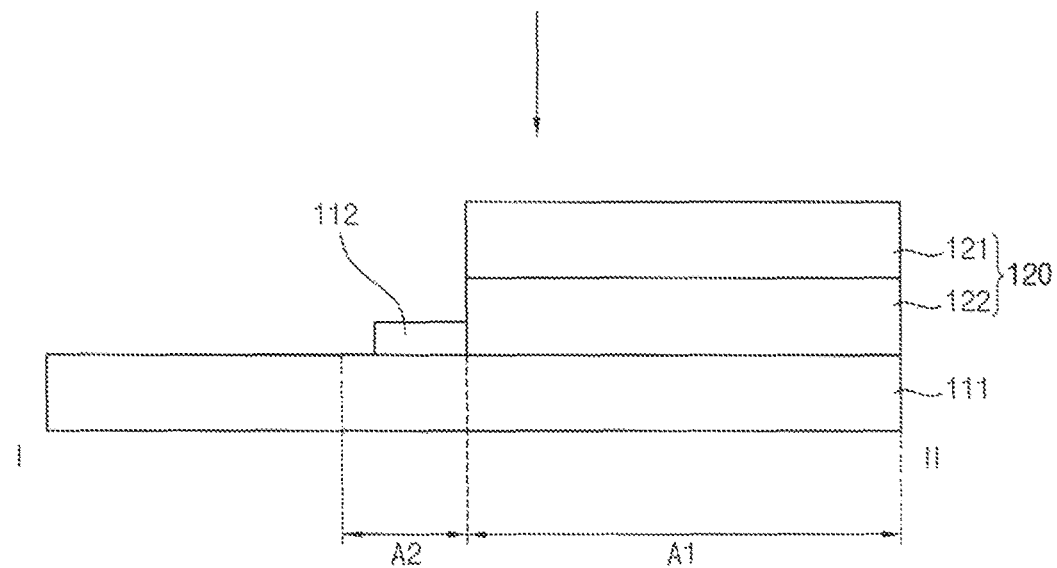

FIGS. 7A and 7B are diagrams illustrating a process of manufacturing the touch sensing unit of FIG. 3A.

Referring to FIG. 7A, the flexible printed circuit 120 may be located on the first area A1 of the substrate 111 (or on the first film 110). As described with reference to FIG. 3B, the first adhesive layer is attached under the flexible printed circuit 120 (or on a lower surface of the flexible printed circuit 120), and the flexible printed circuit 120 may be attached to the substrate 111 through a compressing process.

The adhesive pattern 112 may be formed on at least a portion of the second area A2.

In some Exemplary embodiments, the adhesive pattern 112 may by formed by exposing the second area A2 through an exposure process using an ultraviolet (UV) rays. A light source emitting ultraviolet light having a wavelength in a range of 180 nm through 260 nm may be used. When the ultraviolet light is irradiated, fluorine atoms and fluorine ions included in the substrate 111 may be diffused to an upper surface of the substrate. The exposure process may be performed using a mask including a transmissive portion substantially overlapping with the second area A2. The diffused fluorine atoms, fluorine ions, and the like may be fixed to the upper surface of the substrate 111 by the ultraviolet light and may form the non-adhesive pattern 112. Here, the fluorine atoms or fluorine ions contained in the substrate 111 may be removed.

In an exemplary embodiment, the non-adhesive pattern 112 may be formed through a water-repellent coating process. A resin containing fluorine or silicon may be coated on the second region A2. Through a process of a room temperature drying (or through a pre-curing process), the fluorine or the silicon contained in the resin may be separated from the resin and diffuse or float to the surface of the resin. Here, the surface of the non-adhesive pattern 112 may have hydrophobicity.

Thereafter, the second film 120 may be disposed on the first film 110 and on a portion of the flexible printed circuit 120. As described with reference to FIG. 3B, the second film 120 may be disposed on the first film 110 and on a portion of the flexible printed circuit 120 through the second adhesive layer 132.

As described with reference to FIG. 4, the touch sensing unit 100 may undergo an autoclave process.

Referring to FIG. 7B, the non-adhesive pattern 112 may be formed on at least a portion of the second area A2. As described with reference to FIG. 7A, the non-adhesive pattern 112 may be formed through an exposure process using ultraviolet rays (or an ultraviolet light source), a water-repellent coating process, or the like.

The flexible printed circuit 120 may be disposed on the first area A1 of the substrate 111 (or the first film 110). As described with reference to FIG. 3B, the second adhesive layer is bonded to the lower portion of the flexible printed circuit 120 (or the lower portion of the pad portion 122), and the flexible printed circuit 120 is bonded to the substrate 111 through a compressing process.

Thereafter, the second film 130 may be disposed on the first film 110 and on a portion of the flexible printed circuit 120. As described with reference to FIG. 3B, the second film 120 may be disposed on the first film 110 and on a portion of the flexible printed circuit 120 through the second adhesive layer 132.

As described with reference to FIGS. 7A and 7B, the non-adhesive pattern 112 may be formed before of after the flexible printed circuit 120 is attached on the first film 110 and may be formed through an exposure process, a water-repellent coating process, or the like.

Similarly, the non-adhesive patterns 523 and 524 described with reference to FIGS. 5 and 6 may be formed before of after the flexible printed circuit 120 is attached to the first film 110 and may be formed through an exposure process, a water-repellent coating process, or the like.

Figure 8:
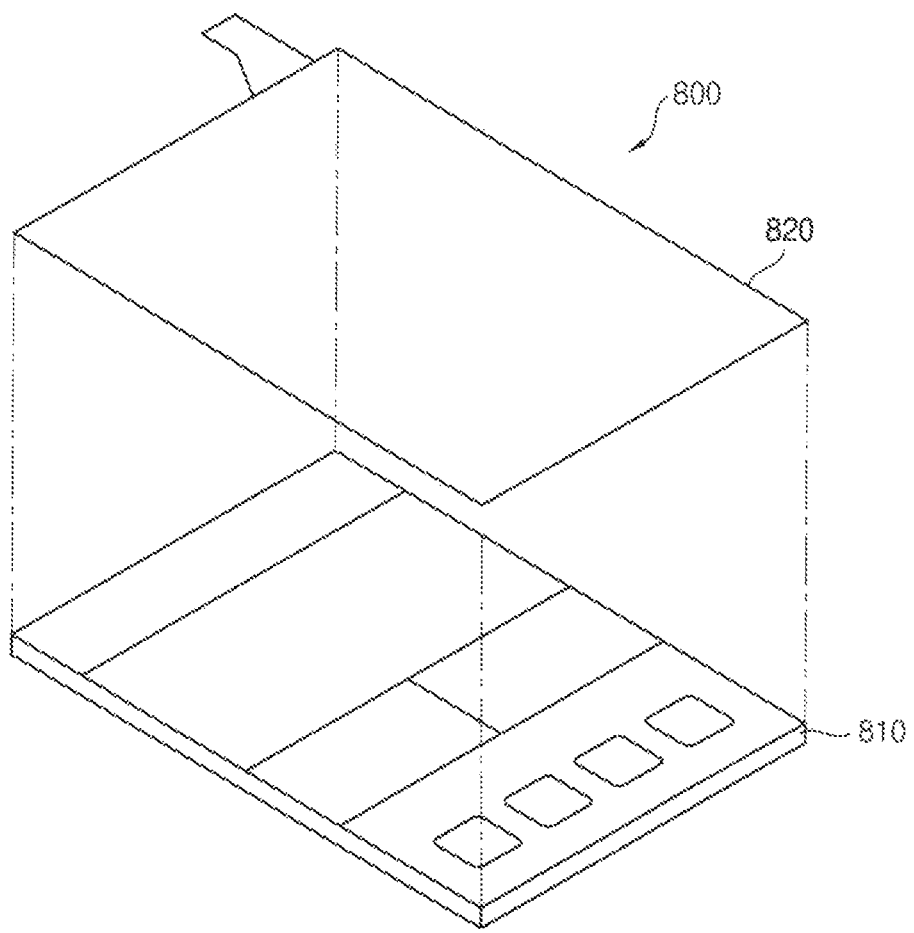
FIG. 8 is a diagram illustrating a display device according to an exemplary embodiment.

FIG. 8 is a diagram illustrating a display device according to an exemplary embodiment.

Referring to FIG. 8, the display device 800 may include a display panel 810 and a touch sensing unit 820. The display device 800 may output an image based on image data provided from the outside. For example, the display device 800 may be an organic light emitting display.

The display panel 810 may include scan lines, data lines, and pixels. The pixels may be arranged in cross-regions of the scan lines and the data lines, may store a data signal in response to the scan signal, and may emit light based on the stored data signal.

The touch sensing unit 820 may be coupled (or attached, located) to an upper portion of the display panel 810. The touch sensing unit 820 may be substantially the same as the touch sensing unit 100 described with reference to FIGS. 1 through 7B. Therefore, duplicated description will not be repeated.

In an exemplary embodiment, the display device 800 may further include driving circuits for driving the display panel 810 and the touch sensing unit 820. For example, the display device 800 includes a scan driving circuit to generate the scan signal, a data driving circuit to generate the data signal based on image data, a timing controller (e.g., T-con) to control the driving circuits (e.g., a driving integrated circuit), and a power supplying circuit to generate power required to drive the display device 800.

Similar to the touch sensing unit 820, the display device 800 may include two films that are attached to each other and may include a substrate disposed between the films and overlapping with only a portion of the films. Here, at least one of the films may include a non-adhesive pattern formed on at least a portion of outer area of the portion of the film (i.e., an area where the substrate is arranged). Therefore, as described with reference to FIGS. 1 and 2, an air path may be formed corresponding to the non-adhesive pattern, and air bubbles between the films may be discharged to the outside through the air path.

The present inventive concept may be applied to any display device (e.g., an organic light emitting display device, a liquid crystal display device, etc). For example, the present inventive concept may be applied to a television, a computer monitor, a laptop, a digital camera, a cellular phone, a smart phone, a personal digital assistant (PDA), a portable multimedia player (PMP), an MP3 player, a navigation system, a video phone, etc.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
a first film comprising a substrate and a non-adhesive pattern, the substrate comprising a first area and a second area adjacent to the first area, the non-adhesive pattern formed on at least a portion of the second area;
a flexible printed circuit disposed on the first area of the first film; and
a second film disposed on the flexible printed circuit and the first film.

2. The display device of claim 1, wherein the non-adhesive pattern comprises fluorine or silicon.

3. The display device of claim 2, wherein the non-adhesive pattern has an adhesive strength less than an adhesive strength of the substrate.

4. The display device of claim 1, wherein:
a first air path is formed between the non-adhesive pattern and the second film; and
the first air path is configured to permit air bubbles generated between the first film and the second film to pass through and be discharged to the outside.

5. The display device of claim 1, wherein the non-adhesive pattern is formed on a third portion of the second area adjacent to a corner of the first area.

6. The display device of claim 1, wherein the non-adhesive pattern is formed on a first portion of the second area adjacent to the first area in a first direction.

7. The display device of claim 6, wherein the non-adhesive pattern is formed on a first portion of the second area adjacent to the first area in a second direction perpendicular to the first direction.

8. The display device of claim 1, wherein the non-adhesive pattern has a thickness less than a thickness of the flexible printed circuit.

9. The display device of claim 1, wherein a width of the non-adhesive pattern is inversely proportional to a thickness of the flexible printed circuit.

10. The display device of claim 9, wherein the width of the non-adhesive pattern is greater than or equal to 20 μm.

11. The display device of claim 1, wherein the non-adhesive pattern is spaced apart from the first area by a first distance.

12. The display device of claim 11, wherein the first distance is proportional to a thickness of the flexible printed circuit.

13. The display device of claim 1, wherein the non-adhesive pattern partially overlaps the flexible printed circuit.

14. The display device of claim 1, wherein the flexible printed circuit comprises:
 a flexible substrate; and
 a second non-adhesive pattern formed on at least a portion of the flexible substrate corresponding to the first area, the second non-adhesive pattern extending in a first direction.

15. The display device of claim 14, wherein a second air path is formed between the second non-adhesive pattern and the second film.

16. A touch sensing unit comprising:
 a first film comprising a substrate and a non-adhesive pattern, the substrate comprising a first area and a second area adjacent to the first area, and the non-adhesive pattern being formed on at least a portion of the second area;
 a flexible printed circuit disposed on the first area of the first film; and
 a second film disposed on the flexible printed circuit and the first film.

17. The touch sensing unit of claim 16, wherein the non-adhesive pattern comprises fluorine or silicon.

18. The touch sensing unit of claim 17, wherein the non-adhesive pattern has an adhesive strength less than an adhesive strength of the substrate.

19. The touch sensing unit of claim 16, wherein the non-adhesive pattern is formed on a third portion of the second area adjacent to a corner of the first area.

20. The touch sensing unit of claim 16, wherein the non-adhesive pattern is formed on a first portion of the second area adjacent to the first area in a first direction.

* * * * *